US008368056B2

(12) United States Patent
Lee

(10) Patent No.: US 8,368,056 B2
(45) Date of Patent: Feb. 5, 2013

(54) ORGANIC LIGHT EMITTING DIODE DISPLAY AND METHOD FOR MANUFACTURING THE SAME

(75) Inventor: Kyung-Jun Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 312 days.

(21) Appl. No.: 12/801,510

(22) Filed: Jun. 11, 2010

(65) Prior Publication Data
US 2011/0084287 A1  Apr. 14, 2011

(30) Foreign Application Priority Data

Oct. 8, 2009  (KR) .................. 10-2009-0095831

(51) Int. Cl.
*H01L 51/50* (2006.01)
(52) U.S. Cl. ............... 257/40; 257/72; 313/503; 438/34
(58) Field of Classification Search .......... 257/40, 257/72, E21.247; 313/503; 438/34, 780
See application file for complete search history.

(56) References Cited

U.S. PATENT DOCUMENTS

| | | | |
|---|---|---|---|
| 2006/0276096 A1* | 12/2006 | Wang et al. | 445/2 |
| 2007/0159094 A1* | 7/2007 | Oh et al. | 313/512 |
| 2009/0078941 A1* | 3/2009 | Tsai et al. | 257/72 |

FOREIGN PATENT DOCUMENTS

| | | |
|---|---|---|
| JP | 10074582 | 3/1998 |
| JP | 2007035322 | 2/2007 |
| JP | 2007042467 | 2/2007 |
| KR | 10-2004-0053801 | 6/2004 |
| KR | 10-2006-0073808 | 6/2006 |
| KR | 10-2007-0074828 | 7/2007 |
| KR | 10-0764292 | 9/2007 |
| KR | 10-2007-0120271 | 12/2007 |

* cited by examiner

*Primary Examiner* — Thomas L Dickey
(74) *Attorney, Agent, or Firm* — Robert E. Bushnell, Esq.

(57) ABSTRACT

An organic light emitting diode display includes a display substrate including organic light emitting diodes and a pixel defining layer having openings for defining respective light emitting regions of the organic light emitting diodes, an encapsulation substrate disposed to face the display substrate, a sealant disposed along the edge of the encapsulation substrate and bonding and sealing the display substrate and the encapsulation substrate together, and a filling material for filling the space between the display substrate and the encapsulation substrate. The pixel defining layer is divided into a plurality of deposit regions having a relatively small height and that are uniformly distributed, and a diffusion region surrounding the plurality of deposit regions and having a larger height than that of the plurality of deposit regions.

20 Claims, 8 Drawing Sheets

ORGANIC LIGHT EMITTING DIODE DISPLAY AND METHOD FOR MANUFACTURING THE SAME

CLAIM OF PRIORITY

This application makes reference to, incorporates the same herein, and claims all benefits accruing under 35 U.S.C§119 from an application entitled ORGANIC LIGHT EMITTING DIODE DISPLAY AND METHOD FOR MANUFACTURING THE SAME earlier filed in the Korean Industrial Property Office on Oct. 8, 2009, and there duly assigned Serial No. 10-2009-0095831 by that Office.

BACKGROUND OF THE INVENTION

1. Field of the Invention

The described technology relates generally to an organic light emitting diode display and a method for manufacturing the same. More particularly, the described technology relates generally to an organic light emitting diode display, which can improve durability and suppress the occurrence of defects, and a method for manufacturing the same.

2. Description of the Related Art

An organic light emitting diode display has a self-luminous characteristic, and because the organic light emitting diode display does not need a separate light source, unlike a liquid crystal display, it can have a relatively small thickness and weight. In addition, since the organic light emitting diode display exhibits high-quality characteristics such as low power consumption, high luminance, high response speed, etc., it is receiving much attention as a next-generation display device for a portable electronic appliance.

In general, the organic light emitting diode display includes a display substrate having an organic light emitting diode, an encapsulation substrate disposed to face the display substrate and protecting the organic light emitting diode of the display substrate, and a sealant for bonding and sealing the display substrate and the encapsulation substrate together. An empty space exists between the display substrate and the encapsulation substrate, thus weakening the mechanical strength of the organic light emitting diode display.

To overcome this problem, a method that improves durability against external impact by a filling material filling in the space between the display substrate and the encapsulation substrate has been used.

However, in the case where the filling material is filled between the display substrate and the encapsulation substrate, the filling material comes into contact with the sealant formed along the edges of the display substrate and the encapsulation substrate. In this process, the filling material has an adverse effect on the hardening of the sealant, thereby deteriorating the sealant. Thus, the sealant is unable to stably bond and seal the display substrate and the encapsulation substrate together.

Moreover, as organic light emitting diode displays are increasingly becoming larger in size, there is a demand for a method for stably and uniformly depositing a filling material.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to solve the aforementioned problems of the background art, and to provide an organic light emitting diode display that can improve durability, suppress the occurrence of defects, and be stably increased in size.

Moreover, the present invention provides a method for manufacturing the organic light emitting diode display.

An organic light emitting diode display in accordance with an exemplary embodiment includes: a display substrate including organic light emitting diodes and a pixel defining layer having openings for defining respective light emitting regions of the organic light emitting diodes; an encapsulation substrate disposed to face the display substrate; a sealant disposed along the edge of the encapsulation substrate and bonding and sealing the display substrate and the encapsulation substrate together; and a filling material for filling the space between the display substrate and the encapsulation substrate. The pixel defining layer is divided into a plurality of deposit regions having a relatively small height and being uniformly distributed, and a diffusion region surrounding the plurality of deposit regions and having a larger height than that of the plurality of deposit regions.

A deposit point may be located in each of the plurality of deposit regions.

The filling material may be deposited on the deposit points and then diffused to the surrounding areas.

The plurality of deposit regions may include first deposit regions having a relatively larger area, and second deposit regions having a smaller area than that of the first deposit regions.

The amount of the filling material deposited through the deposit points of the first deposit regions may be greater than the amount of the filling material deposited through the deposit points of the second deposit regions.

The plurality of deposit regions may have at least two heights.

The first deposit regions and the second deposit regions may have different heights from each other.

In the organic light emitting diode display, the plurality of deposit regions may be formed in the shape of at least one of a square, a rectangle, a diamond, a circle, and an oval.

The diffusion of the filling material may be controlled by adjusting at least one of the vertical and horizontal lengths of the shape of the plurality of deposit regions.

The organic light emitting diode display may further include a plurality of spacers formed on at least one of the display substrate and the encapsulation substrate and maintaining a gap between the display substrate and the encapsulation substrate.

A method for manufacturing an organic light emitting diode display in accordance with an exemplary embodiment includes: forming a display substrate including a pixel defining layer divided into a plurality of deposit regions, where deposit points are respectively located and are uniformly distributed, and a diffusion region surrounding the plurality of deposit regions and having a larger height than that of the plurality of deposit regions; preparing an encapsulation substrate; forming a sealant along the edge of at least one of the display substrate and the encapsulation substrate; depositing the filling material first on the deposit points and then diffusing the filling material to the surrounding areas; and bonding the display substrate and the encapsulation substrate together, with the sealant and the filling material interposed therebetween.

The plurality of deposit regions may include first deposit regions having a relatively larger area, and second deposit regions having a smaller area than that of the first deposit regions.

The amount of the filling material deposited through the deposit points of the first deposit regions may be greater than the amount of the filling material deposited through the deposit points of the second deposit regions.

The plurality of deposit regions may have at least two heights.

The first deposit regions and the second deposit regions may have different heights from each other.

The display substrate may further include organic light emitting diodes, and the pixel defining layer may have openings for defining respective light emitting regions of the organic light emitting diodes.

In the manufacturing method of the organic light emitting diode display, the plurality of deposit regions may be formed in the shape of at least one of a square, a rectangle, a diamond, a circle, and an oval.

The diffusion of the filling material may be controlled by adjusting at least one of the vertical and horizontal lengths of the shape of the plurality of deposit regions.

The method may further include hardening the sealant, with the display substrate and the encapsulation substrate being bonded together.

The method may further include forming a plurality of spacers on at least one of the display substrate and the encapsulation substrate to maintain a gap between the display substrate and the encapsulation substrate.

In accordance with an exemplary embodiment, the organic light emitting diode display can improve durability against impact, suppress the occurrence of defects in a sealing state, and be stably increased in size.

Moreover, in accordance with an exemplary embodiment, the organic light emitting diode display can be effectively manufactured.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
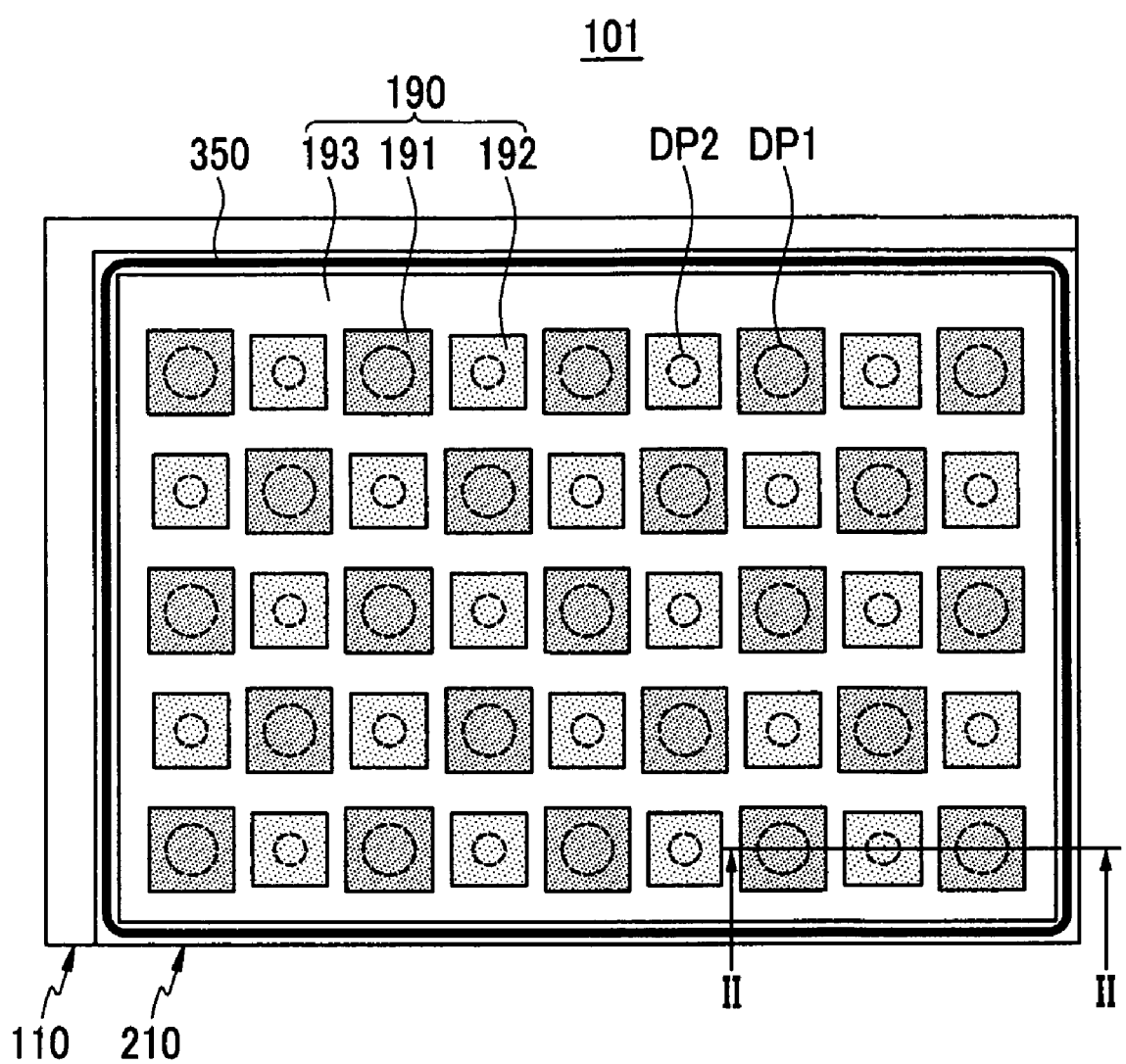
FIG. 1 is a plane layout view of an organic light emitting diode display in accordance with a first exemplary embodiment.

Hereinafter, exemplary embodiments will be described in detail with reference to the accompanying drawings such that those skilled in the art can easily carry out the present invention. The present invention may be embodied in various different forms, and is not to be construed as being limited to the exemplary embodiments set forth herein.

Components having the same structures throughout the exemplary embodiments are denoted by the same reference numerals and are described in a first exemplary embodiment. In the other exemplary embodiments, only the components that are different from those in the first exemplary embodiment are described.

To clearly describe the present invention, parts not related to the description are omitted, and like reference numerals designate like components throughout the specification.

In the drawings, the sizes and thicknesses of the components are merely shown for convenience of explanation, and therefore the present invention is not necessarily limited to the illustrations described and shown herein.

In the drawings, thicknesses are enlarged to clearly express various layers and areas. In the drawings, the thicknesses of some layers and areas are exaggerated for convenience of explanation. It will be understood that when an element such as a layer, film, region, or substrate is referred to as being "on" another element, it can be directly on the other element or intervening elements may also be present.

Now, a first exemplary embodiment will be described with reference to FIGS. 1 and 2. FIG. 1 is a plane layout view of an organic light emitting diode display in accordance with a first exemplary embodiment, and FIG. 2 is a cross-sectional view taken along line II-II of FIG. 1.

Figure 2:
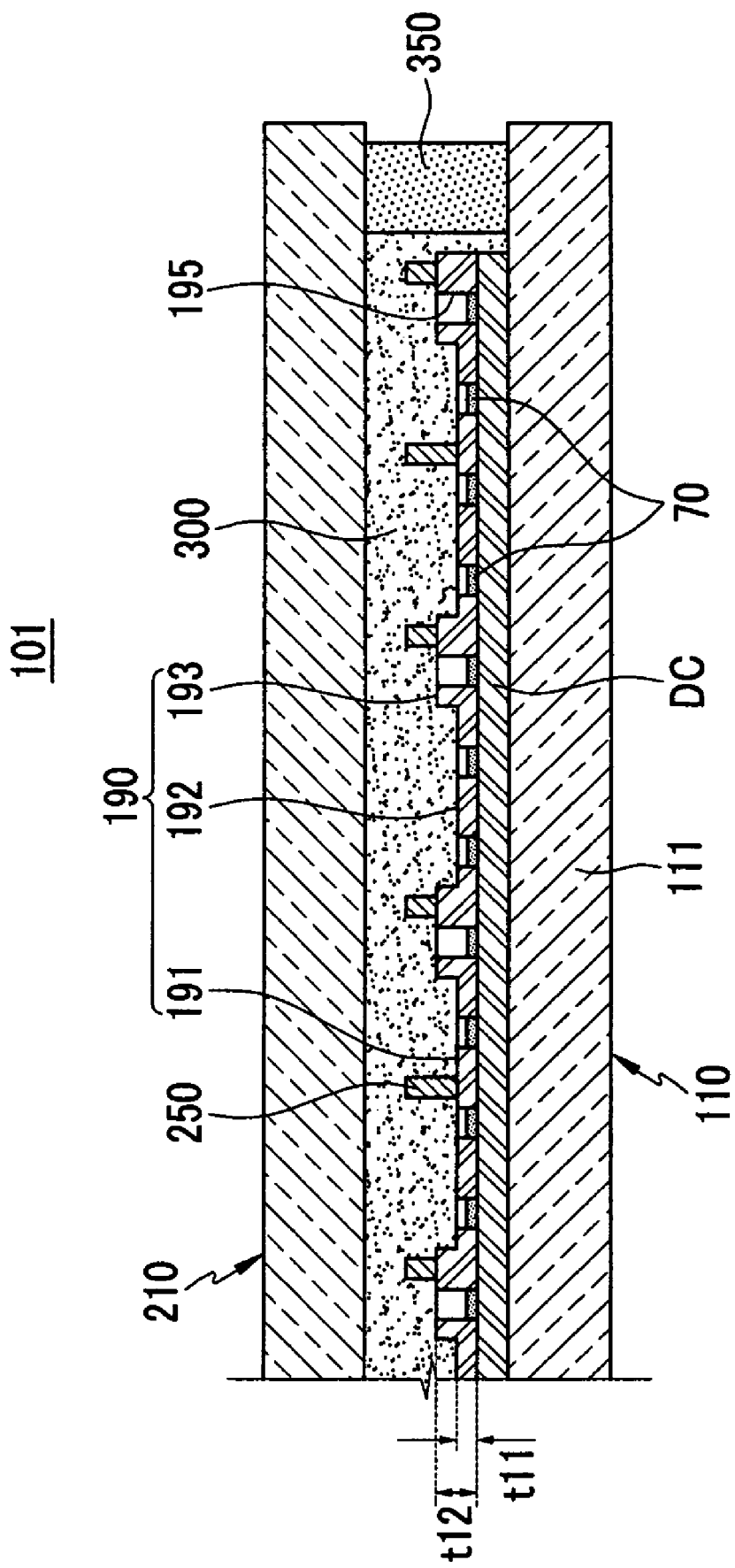
FIG. 2 is a cross-sectional view taken along line II-II of FIG. 1.

As shown in FIGS. 1 and 2, an organic light emitting diode display 101 in accordance with the first exemplary embodiment includes a display substrate 110, an encapsulation substrate 210, a sealant 350, and a filling material 300.

The display substrate 110 includes a substrate main body 111, a driving circuit DC, an organic light emitting diode 70, and a pixel defining layer 190. Moreover, the organic light emitting diode display 101 may further include spacers 250.

The substrate main body 111 may be formed as an insulation substrate made of glass, quartz, ceramic, plastic, or the like. However, the first exemplary embodiment is not limited thereto, and the substrate main body 111 may be formed as a metallic substrate made of stainless steel or the like.

The driving circuit DC is formed on the substrate main body 111. The driving circuit DC includes thin film transistors 10 and 20 (shown in FIG. 3), and drives the organic light emitting diode 70. That is, the organic light emitting diode 70 emits light in response to a driving signal transmitted from the driving circuit DC to display an image.

Figure 3:
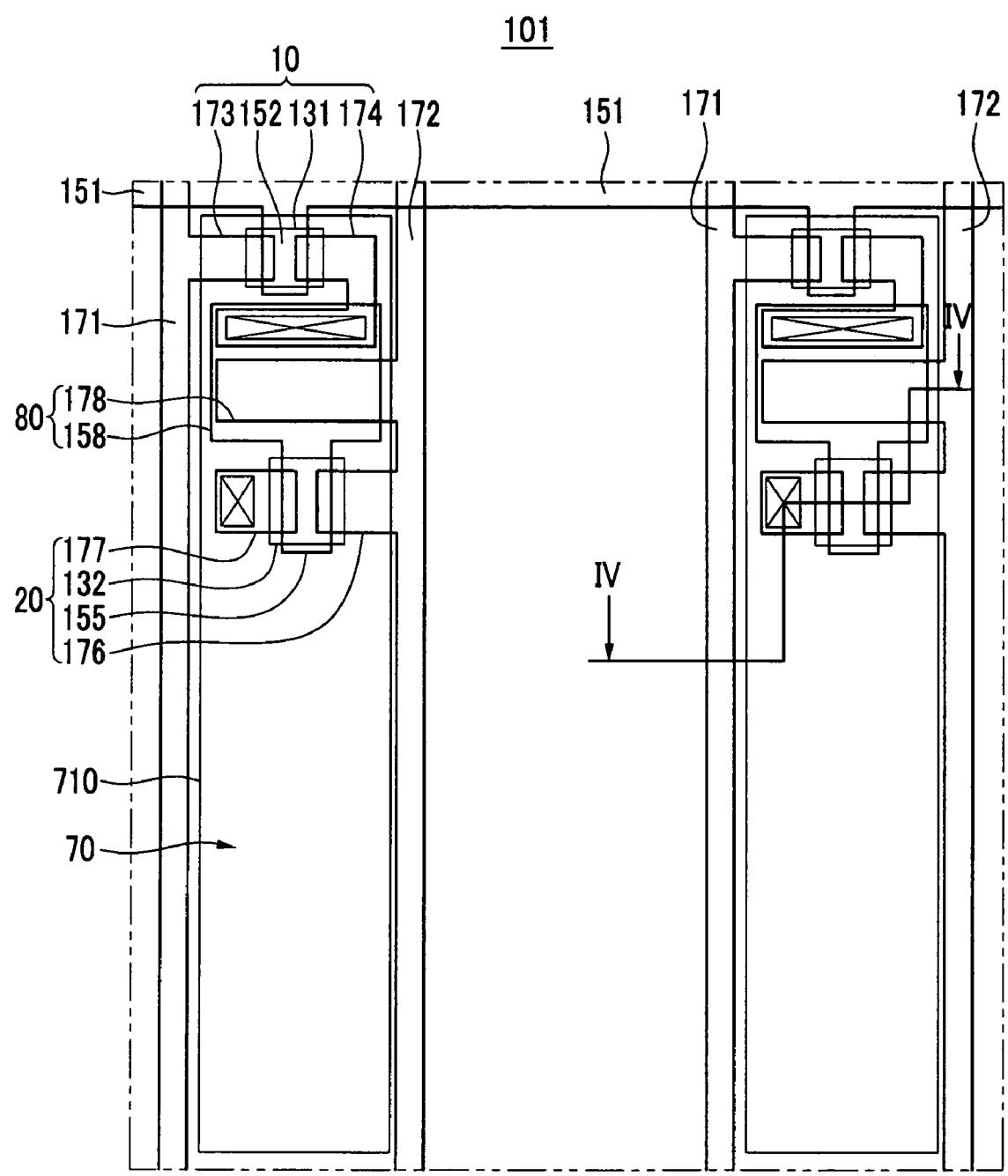
FIG. 3 is a layout view showing an internal structure of the organic light emitting diode display of FIG. 1.
Figure 4:
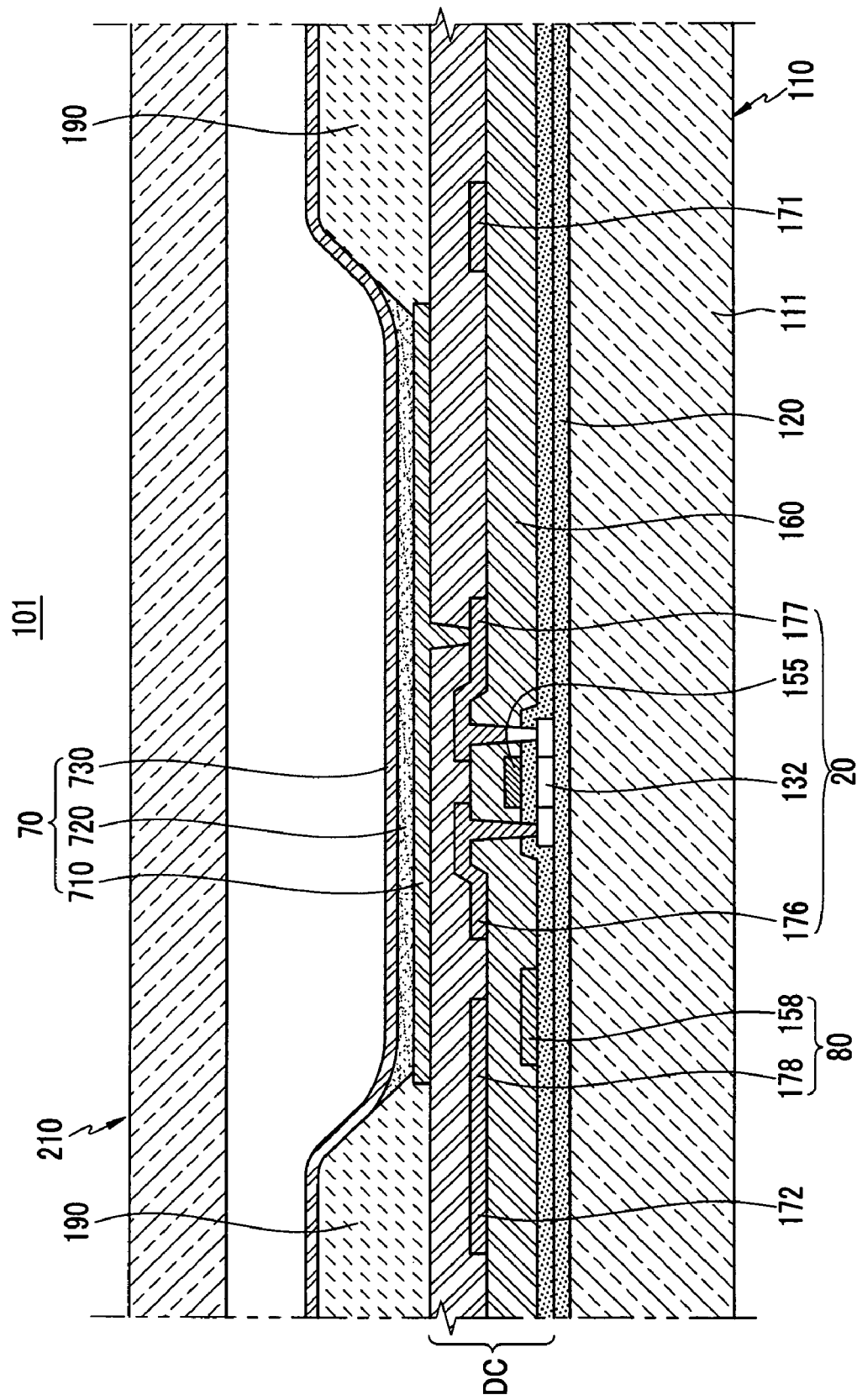
FIG. 4 is a cross-sectional view taken along line IV-IV of FIG. 3.

Although a concrete structure of the driving circuit DC is shown in FIGS. 3 and 4, the first exemplary embodiment is not limited to the structure illustrated therein. The driving circuit DC can be formed in various structures within the range in which those skilled in the art can easily make modifications.

The organic light emitting diode 70 emits light in response to the driving signal transmitted from the driving circuit DC. The organic light emitting diode 70 is divided into a light emitting region that actually emits light and a non-light emitting region formed in the vicinity of the light emitting region.

The pixel defining layer 190 has a plurality of openings 195 for defining the light emitting region of the organic light emitting diode 70. That is, the light emitting region of the organic light emitting diode 70 is formed in the openings of the organic light emitting diode 70.

Moreover, the pixel defining layer 190 is divided into a plurality of deposit regions 191 and 192 and a diffusion region 193 surrounding the plurality of deposit regions 191 and 192.

The plurality of deposit regions 191 and 192 have a relatively small height t11 and are uniformly distributed. A deposit point DP is located in each of the plurality of deposit regions 191 and 192. The diffusion region 193 has a relatively larger height t12 than that of the plurality of deposit regions 191 and 192. Here, the diffusion region 193 surrounds the plurality of deposit regions 191 and 192, and hence the diffusion region 193 is disposed between the sealant 350 and the plurality of deposit regions 191 and 192 where the deposit points DP1 and DP2 are located.

Furthermore, the plurality of deposit regions 191 and 192 include first deposit regions 191 having a relatively large area and second deposit regions 192 having a smaller area than that of the first deposit regions 191. However, the first exemplary embodiment is not limited thereto, and the plurality of deposit regions 191 and 192 may include a number of deposit regions having three or more different areas.

In addition, the plurality of deposit regions 191 and 192 are formed in a square or rectangular shape.

In addition, the pixel defining layer 190 may be made of various materials such as a polyacrylate resin, a polyimide resin, a silica-based inorganic material, etc.

The encapsulation substrate 210 is disposed to face the display substrate 110 and covers the organic light emitting diode 70 and driving circuit DC of the display substrate 110. The encapsulation substrate 210 is formed of a transparent material such as glass, quartz, ceramic, plastic, or the like.

The sealant 350 is disposed along the edge of the encapsulation substrate 210 and bonds and seals the display substrate 110 and the encapsulation substrate 210 together.

The filling material 300 is disposed between the display substrate 110 and the encapsulation substrate 210 to fill the gap space between the display substrate 110 and the encapsulation substrate 210. The filling material 300 is a transparent isotropic material.

The filling material 300 improves the mechanical strength of the organic light emitting diode display 101 by filling the empty space between the display substrate 110 and the encapsulation substrate 210. That is, the inside of the organic light emitting diode display 101 is filled with the filling material 300, thereby improving durability against external impact.

Moreover, the filling material 300 is deposited first on the deposit points DP1 and DP2 respectively located in the plurality of deposit regions 191 and 192, and then diffused to the surrounding areas. The plurality of deposit regions 191 and 192 have a relatively smaller height t11 than that of the diffusion region 193. Thus, the diffusion and flow of the filling material 300 deposited first on the deposit points DP1 and DP2 are controlled by the pixel defining layer 190. That is, the pixel defining layer 190 suppresses the filling material 300 deposited first on the deposit points DP1 and DP2 from contacting the sealant 350 too quickly and having an adverse effect on the a hardening of the sealant 350. This is because the diffusion region 193 having a relatively large height t12 is disposed between the plurality of deposit regions 191 and 192 and the sealant 350.

Furthermore, the filling material 300 is deposited first on the deposit points DP1 and DP2 respectively located in the plurality of deposit regions 191 and 192, so that the filling material 300 can be uniformly and stably deposited even when the organic light emitting diode display 101 becomes larger in size.

In addition, the plurality of deposit regions 191 and 192 have different areas from each other, and hence the filling material 300 can be diffused more uniformly and effectively over a large area. Particularly, when it is desired to deposit a plurality of filling materials 300 that are different from each other, they are deposited in the deposit regions 191 and 192 having an appropriate area depending on the depositing amount of each of the filling materials 300, thereby controlling the diffusion of the filling materials more stably. In addition, even when it is desired to deposit one type of filling material 300, the filling material 300 can be uniformly deposited and diffused stably and effectively by adjusting the amount of the filling material 300 to be deposited at each of the deposit points DP1 and DP2 in proportion to the area of each of the plurality of deposit regions 191 and 192. The amount of the filling material 300 deposited through the first deposit regions 191 having a relatively large area is greater than the amount of the filling material 300 deposited through the second deposit regions 192 having a relatively small area.

Additionally, although the plurality of deposit regions 191 and 192 where the deposit points DP1 and DP2 on which the filling material 300 is deposited first are located have a square or rectangular shape, the length of the rectangular shape can be adjusted according to the direction in which the filling material 300 is intended to be diffused. That is, when it is desired to deposit the filling material 300 such that diffusion is predominantly in a horizontal direction, the deposit regions 191 and 192 can be formed in a rectangular shape that is longer in the horizontal direction.

The spacers 250 are formed in a plural number on at least one of the display substrate 110 and the encapsulation substrate 210, and maintain a gap between the display substrate 110 and the encapsulation substrate 210. In the organic light emitting diode display 101 in accordance with the first exemplary embodiment, the spacers 250 serve to prevent the organic light emitting diode 70 of the display substrate 110 from becoming damaged or defective due to contact between the display substrate 110 and the encapsulation substrate 210. Thus, it should be sufficient if the spacers 250 only prevent the display substrate 110 and the encapsulation substrate 210 from contacting each other. That is, it is not necessary for the spacers 250 to provide a uniform gap between the display substrate 110 and the encapsulation substrate 210 over the entire area.

Moreover, the plurality of spacers 250 may have different heights in consideration of the height of the pixel defining layer 190 depending on the positions where they are formed.

Furthermore, the plurality of spacers 250, along with the pixel defining layer 190, may control the diffusion and flow of the filling material 300. In order to control the diffusion and flow of the filling material 300, the width, height, shape, density, etc., of the spacers 250 can be properly adjusted.

With this configuration, the organic light emitting diode display 101 can improve durability against external impact and suppress the occurrence of defects in a sealing state. Moreover, even if the organic light emitting diode display 101 becomes larger in size, the filling material 300 can be uniformly deposited stably and effectively.

Now, the internal structure of the organic light emitting diode display 101 will be described in detail with reference to FIGS. 3 and 4. FIG. 3 is a layout view showing a structure of a pixel mainly with respect to the display substrate, and FIG. 4 is a cross-sectional view showing the display substrate 110 and the encapsulation substrate 210 together, taken along line II-IV of FIG. 3.

Although FIGS. 3 and 4 illustrate an active matrix (AM)-type organic light emitting diode display 101 having a 2Tr-1Cap structure in which one pixel includes two thin film transistors (TFTs) 10 and 20 and one capacitor 80, the first exemplary embodiment is not limited thereto. Accordingly, the organic light emitting diode display 101 may be configured so that one pixel includes three or more thin film transistors and two or more capacitors, and may have various structures by forming additional wiring. Here, a pixel refers to the smallest unit displaying an image, and is disposed in each pixel area. The organic light emitting diode display 101 displays an image through a plurality of pixels.

As illustrated in FIG. 3 and FIG. 4, each pixel of the display substrate 110 includes a switching thin film transistor 10, a driving thin film transistor 20, a capacitor 80, and an organic light emitting diode 70. Here, a component including the switching thin film transistor 10, the driving thin film transistor 20, and the capacitor 80 is referred to as the driving circuit DC. The display element 110 further includes a gate line 151 arranged along one direction, a data line 171 insulated from and crossing the gate line 151, and a common power line 172.

One pixel may be defined by the gate line 151, the data line 171, and the common line 172, but the present invention is not necessarily limited thereto.

The organic light emitting diode 70 includes a first electrode 710 serving as an anode, a second electrode 730 serving as a cathode, and an organic emission layer 720 disposed between the first electrode 710 and the second electrode 730. However, the first exemplary embodiment is not limited thereto. Accordingly, the first electrode 710 may be a cathode electrode, and the second electrode 730 may be an anode electrode.

The first electrode 710 and the second electrode 730 are formed from a reflective layer or a semi-transmissive layer. That is, the organic light emitting diode display 101 may have one of the structures of front, rear, and dual display types depending on the structure of the first electrode and the second electrode.

The reflective layer and the semi-transmissive layer are made of at least one metal of magnesium (Mg), silver (Ag), gold (Au), calcium (Ca), lithium (Li), chromium (Cr), and aluminum (Al), or an alloy thereof. The reflective layer and the semi-transmissive layer are determined by thickness. In general, the semi-transmissive layer has a thickness of less than 200 nm. The thinner the semi-transmissive layer, the higher the transmittance of light, and the thicker the semi-transmissive layer, the lower the transmittance of light.

The first electrode 710 may further include a transparent conductive layer disposed adjacent to the organic emission layer. The transparent conductive layer is made of indium tin oxide (ITO), indium zinc oxide (IZO), zinc oxide (ZnO), or indium oxide (In2O3). The transparent conductive layer has a relatively high work function, and allows holes to be smoothly injected into the organic emission layer from the first electrode.

The organic emission layer 720 is formed as a multiple layer including one or more of an emission layer, a hole injection layer (HIL), a hole transport layer (HTL), an electron transport layer (ETL), and an electron injection layer (EIL). In the case where the organic emission layer 720 includes all of these layers, the hole injection layer is disposed on the first electrode 710, and then the hole transport layer, the emission layer, the electron transport layer, and the electron injection layer are sequentially stacked on the hole injection layer. The organic emission layer 720 may further include another layer if necessary.

The structure of the organic light emitting diode 70 in the first exemplary embodiment is not limited only to the structure as stated above. The organic light emitting diode 70 can be formed in various structures within the range in which those skilled in the art can easily make modifications.

The capacitor 80 includes a pair of capacitor plates 158 and 178 disposed with an interlayer insulating layer 160 interposed therebetween. Here, the interlayer insulating layer 160 is a dielectric material. Storage capacity is determined by the electric charges stored in the capacitor 80 and the voltage between both of the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer (channel region) 132, a driving gate electrode 155, a driving source electrode 176, and a drain electrode 177.

The switching thin film transistor 10 is used as a switching element to select a pixel to emit light. The switching gate electrode 152 is connected to the gate line 151. The switching source electrode 173 is connected to the data line 171. The switching drain electrode 174 is spaced apart from the switching source electrode 173 and connected to one of the capacitor plates (158).

The driving thin film transistor 20 applies driving power to the pixel electrode 710 to emit light from the organic emission layer 720 of the organic light emitting diode 70 in the selected pixel. The driving gate electrode 155 is connected to the capacitor plate 158 connected to the switching drain electrode 174. The driving source electrode 176 and the other capacitor plate 178 are connected to the common power line 172. The driving drain electrode 177 is connected to the pixel electrode 710 of the organic light emitting diode 70 through a contact hole.

With the above-described configuration, the switching thin film transistor 10 is driven by a gate voltage applied to the gate line 151, and supplies a data voltage applied to the data line 171 to the driving thin film transistor 20. A voltage corresponding to the difference between the common voltage that is supplied from the common power line 172 to the driving thin film transistor 20, and the data voltage that is supplied from the switching thin film transistor 10, is stored in the capacitor 80. A current corresponding to the voltage stored in the capacitor 80 flows into the organic light emitting diode 70 through the driving thin film transistor 20 to make the organic light emitting diode 70 emit light. That is, holes and electrons are injected into the organic emission layer 720 from the first electrode 710 and the second electrode 730, respectively, and when excitons formed by recombinations of the injected holes and electrons drop from an excited state to a ground state, the organic light emitting diode 70 emits light.

Now, a method for manufacturing the organic light emitting diode display 101 in accordance with the first exemplary embodiment will be described with reference to FIG. 5.

Figure 5:
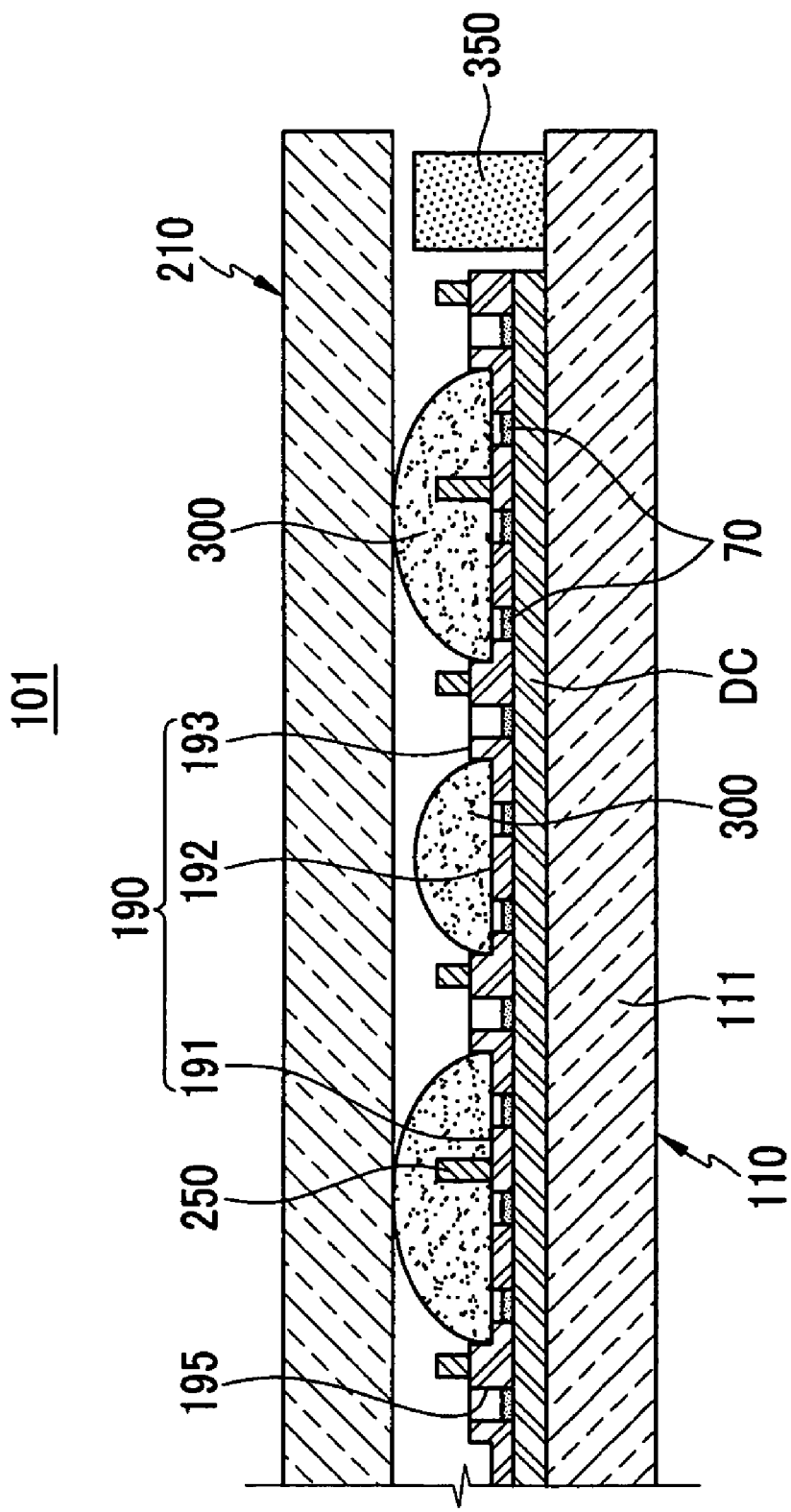
FIG. 5 is a cross-sectional view showing a part of a manufacturing process of the organic light emitting diode display of FIG. 1.

As shown in FIG. 5, a display substrate 110 and an encapsulation substrate 210 are prepared, respectively.

The display substrate 110 includes a driving circuit DC, an organic light emitting element 70, and a pixel defining layer 190. The pixel defining layer 190 is divided into a plurality of deposit regions 191 and 192 where deposit points DP1 and DP2 (shown in FIG. 1) are respectively located and that are uniformly distributed, and a diffusion region 193 surrounding the plurality of deposit regions 191 and 192 and having a larger height than that of the plurality of deposit regions 191 and 192. Further, the pixel defining layer 190 has openings 195 for defining a light emitting region of the organic light emitting diode 70.

The plurality of deposit regions 191 and 192 include first deposit regions 191 having a relatively large area and second deposit regions 192 having a smaller area than that of the first deposit regions 191. The plurality of deposit regions 191 and 192 have a square or rectangular shape.

Next, a plurality of spacers 250 are formed on the pixel defining layer 190 of the display substrate 110. However, the first exemplary embodiment is not limited thereto, and the spacers 250 may be formed on one surface of the encapsulation substrate 210 that is disposed to face the display substrate 110.

Moreover, the spacers 250 may be integrally formed with the pixel defining layer 190. That is, the pixel defining layer 190 and the spacers 195 may be formed together by adjusting the amount of exposure by means of half-tone exposure or double exposure when forming the pixel defining layer 190. The pixel defining layer 190 and the spacers 195 may be made of a polyacrylate resin, a polyimide resin, a silica-based inorganic material, or the like.

Next, a sealant 350 is formed on the display substrate 110 along the edge of the display substrate 110. The sealant 350 is disposed adjacent to the diffusion region 193. That is, the diffusion region 193 is located between the sealant 350 and the plurality of deposit regions 191 and 192. Here, the sealant 350 is not necessarily formed on the display substrate 110. Thus, the sealant 350 may be formed on the encapsulation substrate 210. However, in the case where the sealant 350 is formed on the encapsulation substrate 210, the sealant 350 must be formed at a position where the sealant 350 can be adjacent to the diffusion region 193 of the pixel defining layer 190 when the display substrate 110 and the encapsulation substrate 210 are bonded together.

Next, a filling material 300 is deposited on the deposit points DP1 and DP2 respectively located in the plurality of deposit regions 191 and 192, and then diffused to the surrounding areas. The diffusion and flow of the filling material 300 are controlled by the diffusion region 193 having a relatively large thickness and surrounding the plurality of deposit regions 191 and 192. That is, the diffusion region 193 of the pixel defining layer 190 delays the contact of the filling material 300 with the sealant 350 as long as possible. In this way, the pixel defining layer 190 suppresses the filling material 300 from contacting the sealant 350 too quickly, thereby minimizing an adverse effect of the filling material 300 on the hardening of the sealant 350. Moreover, the pixel defining layer 190 has the filling material 300 deposited through the deposit points DP1 and DP2 respectively formed in the plurality of deposit regions 191 and 192, so that the filling material 300 can be uniformly deposited effectively and stably over a large area.

Next, the display substrate 110 and the encapsulation substrate 210 are bonded together by a vacuum bonding method, with the sealant 350 and the filling material 300 interposed therebetween. Then, the sealant 350 is hardened to thus completely seal between the display substrate 110 and the encapsulation substrate 210.

By this manufacturing method, the organic light emitting diode display 101 can improve durability against impact and suppress the occurrence of defects in a sealing state. Moreover, even when the organic light emitting diode display 101 becomes larger in size, the filling material can be uniformly deposited both stably and effectively.

Now, a second exemplary embodiment will be described with reference to FIG. 6.

Figure 6:
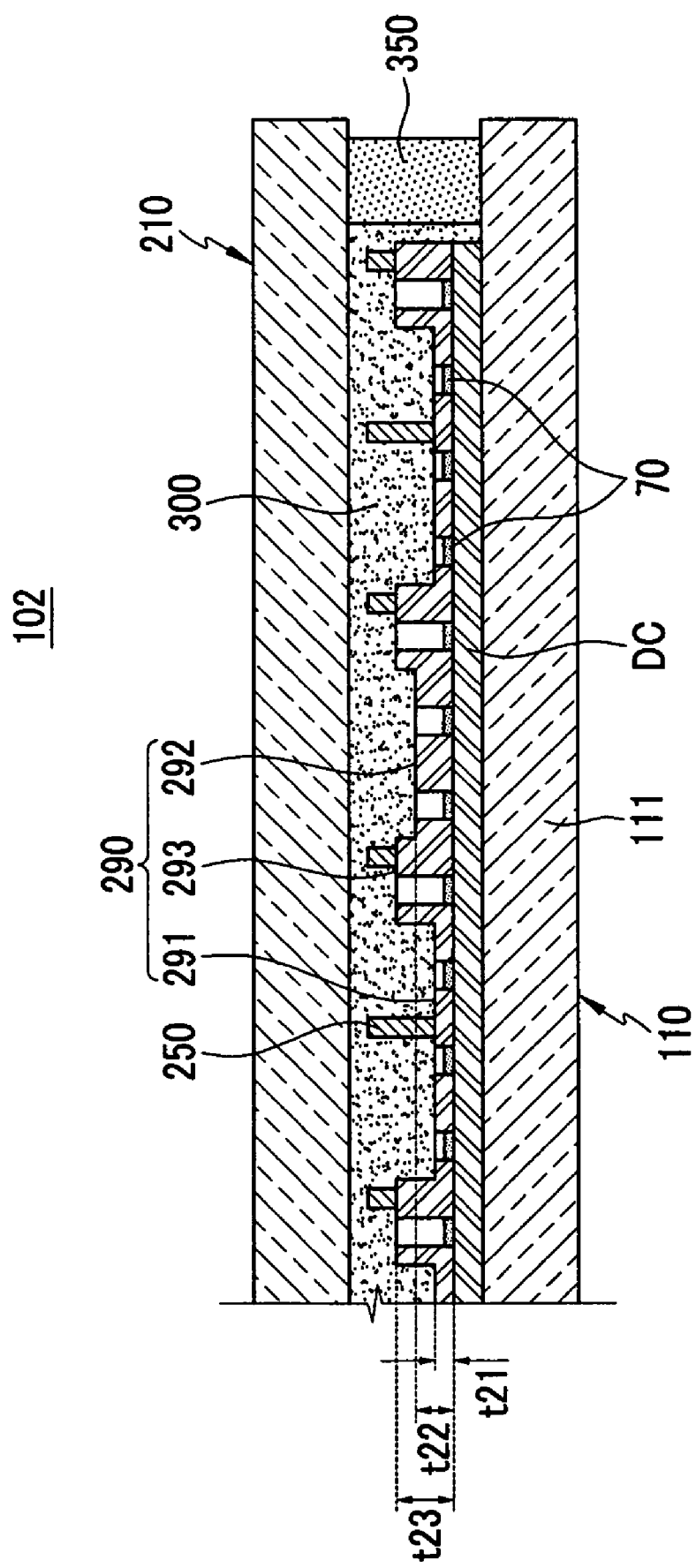
FIG. 6 is a partial cross-sectional view of an organic light emitting diode display in accordance with a second exemplary embodiment.

As shown in FIG. 6, an organic light emitting diode display 102 in accordance with the second exemplary embodiment includes a pixel defining layer 290 where a plurality of deposit regions 291 and 292 have at least two heights t21 and t22. In FIG. 6, the plurality of deposit regions 291 and 292 include first deposit regions 291 and second deposit regions 292 having a larger height than that of the first deposit regions 291. That is, the height t21 of the first deposit regions 291 is smaller than the height t22 of the second depositing regions 292. Here, both of the first deposit regions 291 and the second deposit regions 292 are formed lower than the height t23 of a diffusion region 293. Moreover, the first deposit regions 291 have a larger area than that of the second deposit regions 292. Accordingly, the first deposit regions 291 can have a relatively larger amount of the filling material 300 deposited thereon than that of the second deposit regions 292.

With this configuration, the organic light emitting diode display 102 in accordance with the second exemplary embodiment allows each of the plurality of deposit regions 291 and 292 to have various amounts of the filling material 300 deposited thereon more effectively.

A method for manufacturing the organic light emitting diode display 102 in accordance with the second exemplary embodiment is identical to the method for manufacturing the organic light emitting diode display 101 in accordance with the first exemplary embodiment, except that the first deposit regions 291 and the second deposit regions 292 have different heights from each other.

Now, a third exemplary embodiment will be described with reference to FIG. 7.

Figure 7:
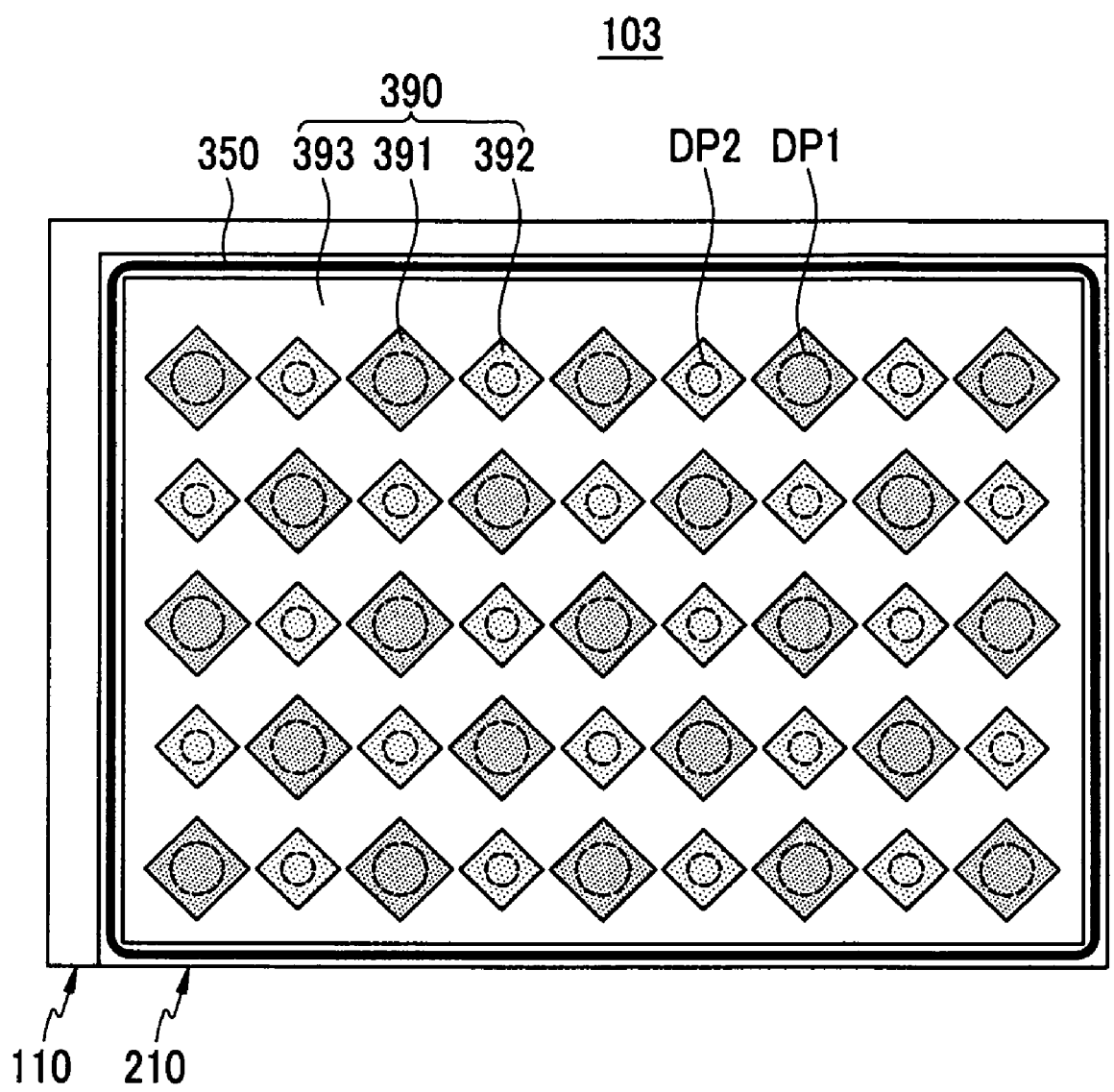
FIG. 7 is a plane layout view showing an organic light emitting diode display in accordance with a third exemplary embodiment.

As shown in FIG. 7, an organic light emitting diode display 103 in accordance with the third exemplary embodiment includes a pixel defining layer 390 where a plurality of deposit regions 391 and 392 are formed in a diamond shape. Moreover, a diffusion region 393 of the pixel defining layer 390 is formed with a height greater than that of the plurality of deposit regions 391 and 392 to control the diffusion of a filling material 300.

The diagonal length of the diamond shape of the plurality of deposit regions 391 and 392 can be adjusted according to the direction in which the filling material 300 is intended to be diffused. That is, when it is desired to diffuse the filling material 300 equally in vertical and horizontal directions, the diagonal length of the diamond shape of the plurality of deposit regions 391 and 392 can be made equal in the vertical and horizontal directions. On the other hand, when it is desired to diffuse the filling material 300 predominantly in the horizontal direction rather than in the vertical direction, the horizontal diagonal length of the diamond shape of the plurality of deposit regions 391 and 392 can be made longer.

With this configuration, the organic light emitting diode display 103 in accordance with the third exemplary embodiment can control the flow of the filling material 300 more effectively.

A method for manufacturing the organic light emitting diode display 103 in accordance with the third exemplary embodiment is identical to the method for manufacturing the organic light emitting diode display 101 in accordance with the first exemplary embodiment, except that the plurality of deposit regions 391 and 392 are formed in a diamond shape.

Now, a fourth exemplary embodiment will be described with reference to FIG. 8.

Figure 8:
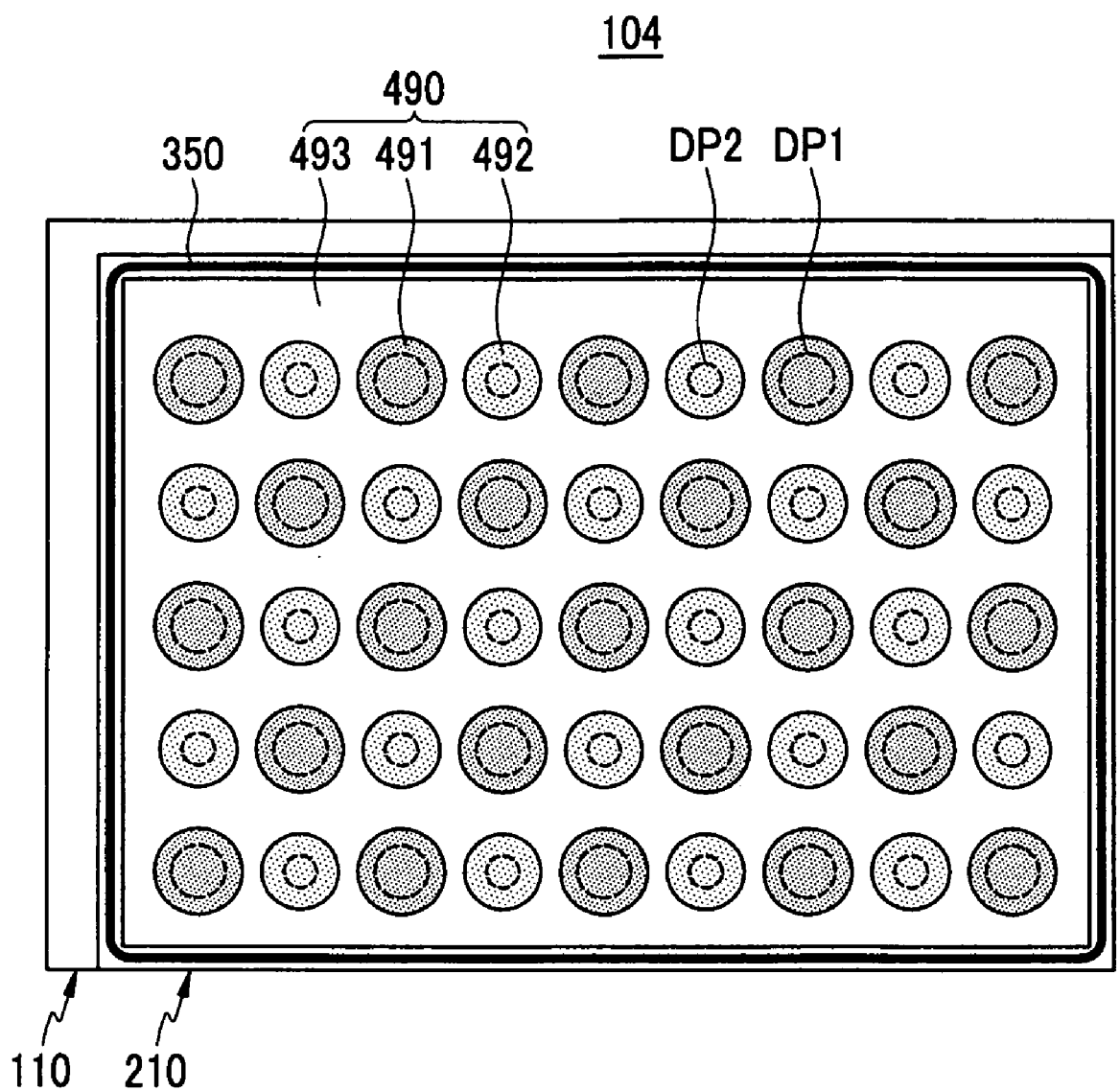
FIG. 8 is a plane layout view showing an organic light emitting diode display in accordance with a fourth exemplary embodiment.

As shown in FIG. 8, an organic light emitting diode display 104 in accordance with the fourth exemplary embodiment includes a pixel defining layer 490 where a plurality of deposit regions 491 and 492 are formed in a round shape. Moreover, a diffusion region 493 of the pixel defining layer 490 is formed with a height greater than that of the plurality of deposit regions 491 and 492 to control the diffusion of a filling material 300.

The plurality of deposit regions 491 and 492 can be formed in an oval shape according to the direction in which the filling material 300 is intended to be diffused. That is, when it is desired to diffuse the filling material 300 predominantly in a horizontal direction, the plurality of deposit regions 491 and 492 can be formed in an oval shape whose diameter is longer in the horizontal direction.

With this configuration, the organic light emitting diode display 104 in accordance with the fourth exemplary embodiment can control the flow of the filling material 300 more effectively.

A method for manufacturing the organic light emitting diode display 104 in accordance with the fourth exemplary embodiment is identical to the method for manufacturing the organic light emitting diode display 101 in accordance with the first exemplary embodiment, except that the plurality of deposit regions 491 and 492 are formed in a round or oval shape.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
    a display substrate including organic light emitting diodes and a pixel defining layer having openings for defining respective light emitting regions of the organic light emitting diodes;
    an encapsulation substrate disposed to face the display substrate;
    a sealant disposed along edges of the encapsulation substrate and the display substrate, the sealant bonding and sealing the display substrate and the encapsulation substrate together; and
    a filling material filling vacant spaces between the display substrate and the encapsulation substrate, the pixel defining layer being divided into a plurality of deposit regions having a relatively small height and uniformly distributed, and a diffusion region surrounding the plurality of deposit regions and having a larger height than that of the plurality of deposit regions, the deposit regions receiving the filling material prior to diffusion of the filling material for filling the vacant spaces, the diffusion regions suppressing flow of the filling material during the diffusion, the filling material filling all empty spaces between the display substrate and the encapsulation substrate following the diffusion.

2. The organic light emitting diode display of claim wherein
    a deposit point is located in each of the plurality of deposit regions.

3. The organic light emitting diode display of claim 2, wherein
    the filling, material is deposited on the deposit points and then diffused to the surrounding areas.

4. The organic light emitting diode display of claim 3, wherein
    the deposit points comprise first deposit points having a large surface area and second deposit points having a smaller surface area than that of the first deposit points.

5. The organic light emitting diode display of claim 4, wherein
    an amount of the filling material deposited on the first deposit points is greater than an amount of the fining material deposited on the second deposit points.

6. The organic light emitting diode display of claim 4, wherein
    the plurality of deposit regions have at least two heights.

7. The organic light emitting diode display of claim 6, wherein
    the first deposit points and the second deposit points have different heights from each other.

8. The organic light emitting diode display of claim 1, wherein
    the plurality of deposit regions are formed in the shape of at least one of a square, a rectangle, a diamond, a circle, and an oval.

9. The organic light emitting diode display of claim 8, wherein
    the diffusion of the filling material is controlled by at least one of a vertical height and a horizontal length of the shape of the plurality of deposit regions.

10. The organic light emitting diode display of claim 8, wherein
    the organic light emitting diode display further comprises a plurality of spacers formed on the pixel defining layer to maintain a non-contact gap between the display substrate and the encapsulation substrate.

11. A method for manufacturing an organic light emitting diode display, comprising:
    forming a display substrate including a pixel defining layer divided into a plurality of deposit regions having uniformly distributed, deposit points respectively located thereon, and a diffusion region surrounding the plurality of deposit regions, each diffusion region having, a larger height than a height of each of the plurality of deposit regions;
    preparing an encapsulation substrate;
    forming a sealant along the edge of at least one of the display substrate and the encapsulation substrate;
    depositing a filling material first on the deposit points and then diffusing the filling material to the surrounding areas, the diffusion regions suppressing flow of the filling material during the diffusion the filling material filling all empty spaces between the display substrate and the encapsulation substrate following the diffusion; and
    bonding the display substrate and the encapsulation substrate together along their respective edges, with the sealant and the filling material interposed therebetween.

12. The method of claim 11, the plurality of deposit regions comprising first deposit regions having a large area and second deposit regions having a smaller area than the area of the first deposit regions.

13. The method of claim 12, the amount of the filling material deposited on the deposit points of the first deposit regions being greater than the amount of the filling material deposited on the deposit points of the second deposit regions.

14. The method of claim 11, the plurality of deposit regions having at least two heights.

15. The method of claim 12, the first deposit regions and the second deposit regions having different heights from each other.

16. The method of claim 11, the display substrate further comprising:
    a plurality of organic light emitting diodes; and
    the pixel defining layer having openings for defining respective light emitting regions of the organic light emitting diodes.

17. The method of claim 11, the plurality of deposit regions being formed in the shape of at least one of a square, a rectangle, a diamond, a circle, and an oval.

18. The method of claim 17, the diffusion of the filling material being controlled by adjusting at least one of the vertical and horizontal lengths of the shape of the plurality of deposit regions.

19. The method of claim 17, further comprising hardening the sealant, with the display substrate and the encapsulation substrate being bonded together.

20. The method of claim 17, further comprising forming a plurality of spacers on the pixel defining layer to maintain a non-contact a gap between the display substrate and the encapsulation substrate.

* * * * *